United States Patent
Chen et al.

(10) Patent No.: US 10,658,541 B2
(45) Date of Patent: May 19, 2020

(54) SELECTIVE GROWTH OF NITRIDE BUFFER LAYER

(71) Applicant: Xiamen Changelight Co., Ltd., Xiamen, Fujian (CN)

(72) Inventors: Kaixuan Chen, Fujian (CN); Zhiwei Lin, Fujian (CN); Xiangjing Zhou, Fujian (CN); Gang Yao, Fujian (CN); Aimin Wang, Fujian (CN)

(73) Assignee: Xiamen Changelight Co., Ltd., Xiamen (CN)

( * ) Notice: Subject to any disclaimer, the term of this patent is extended or adjusted under 35 U.S.C. 154(b) by 0 days.

(21) Appl. No.: 16/050,899

(22) Filed: Jul. 31, 2018

(65) Prior Publication Data
US 2019/0103506 A1    Apr. 4, 2019

(30) Foreign Application Priority Data

Sep. 30, 2017 (CN) .......................... 2017 1 0919143

(51) Int. Cl.
| | |
|---|---|
| *H01L 33/00* | (2010.01) |
| *H01L 33/32* | (2010.01) |
| *H01L 33/16* | (2010.01) |
| *H01L 21/02* | (2006.01) |
| *H01L 33/12* | (2010.01) |

(52) U.S. Cl.
CPC ...... *H01L 33/0075* (2013.01); *H01L 21/0243* (2013.01); *H01L 21/0254* (2013.01); *H01L 21/02458* (2013.01); *H01L 21/02639* (2013.01); *H01L 33/007* (2013.01); *H01L 33/16* (2013.01); *H01L 33/32* (2013.01); *H01L 33/12* (2013.01)

(58) Field of Classification Search
None
See application file for complete search history.

(56) References Cited

U.S. PATENT DOCUMENTS

| | | | |
|---|---|---|---|
| 9,978,845 B2 * | 5/2018 | Han | .................... H01L 21/0242 |
| 2011/0315998 A1 | 12/2011 | Hashimoto et al. | |
| 2014/0191284 A1 * | 7/2014 | Bayram | .............. H01L 29/2003 257/190 |

FOREIGN PATENT DOCUMENTS

| | | |
|---|---|---|
| CN | 105355739 A | 2/2016 |
| CN | 105814245 A | 7/2016 |
| CN | 107731978 A | 2/2018 |

OTHER PUBLICATIONS

International Search Report and the Written Opinion issued in PCT/IB2018/055749 dated Oct. 31, 2018, 11 pages.

* cited by examiner

*Primary Examiner* — Michelle Mandala
(74) *Attorney, Agent, or Firm* — Arch & Lake LLP

(57) ABSTRACT

According to at least some embodiments of the present disclosure, a method of manufacturing semiconductor wafers comprises: selectively growing a nitride buffer layer on a first surface of a patterned substrate, the patterned substrate including at least the first surface and a second surface; and growing an epitaxial layer on the nitride buffer layer, wherein a crystal surface of the epitaxial layer grows along a normal direction of the patterned substrate. The epitaxial layer does not include multiple crystal surfaces having different crystal growth directions that cause a stress at a junction interface where the crystal surfaces having the different crystal growth directions meet.

20 Claims, 4 Drawing Sheets

800

805 Dispose a sacrificial layer on a first surface and a second surface of a patterned substrate 810 Expose the first surface by removing the first portion of the sacrificial layer disposed on the first surface 815 Grow an original nitride buffer layer on both the first surface and the second portion of the sacrificial layer 820 Remove a top portion of the original nitride buffer layer by a first wet etching process or a dry etching process to exposed a top portion of the second portion of the sacrificial layer 825 Lift off the second portion of the sacrificial layer disposed on the second surface and a portion of the original nitride buffer layer disposed on the second portion of the sacrificial layer by a second wet etching process 830 Grow an epitaxial layer on the nitride buffer layer, wherein a crystal surface of the epitaxial layer grows along a normal direction of the patterned substrate

FIG. 8

SELECTIVE GROWTH OF NITRIDE BUFFER LAYER

CROSS-REFERENCE TO RELATED APPLICATIONS

This application claims priority to Chinese Patent Application 201710919143.6, filed Sep. 30, 2017, which is incorporated herein by reference in its entirety.

BACKGROUND

Light-emitting diodes (LEDs) are used as semiconductor light sources. Because of various advantages such as high brightness, long product life, small footprint and low power consumption, LEDs are considered to be the choice of the illumination devices of the next generation. A goal for research and development in the LED field is to improve the luminous efficacies of the LEDs and epitaxial wafers for manufacturing LED chips.

SUMMARY

According to at least some embodiments of the present disclosure, a method of manufacturing semiconductor wafers comprises: selectively growing a nitride buffer layer on a first surface of a patterned substrate, the patterned substrate including at least the first surface and a second surface; and growing an epitaxial layer on the nitride buffer layer. A crystal surface of the epitaxial layer grows along a normal direction of the patterned substrate. The epitaxial layer does not include multiple crystal surfaces having different crystal growth directions that cause a stress at a junction interface where the crystal surfaces having the different crystal growth directions meet.

In some embodiments, the nitride buffer layer is selectively grown by a process of: disposing a sacrificial layer on the first surface and the second surface of the patterned substrate, the sacrificial layer including a first portion disposed on the first surface and a second portion disposed on the second surface; exposing the first surface by removing the first portion of the sacrificial layer disposed on the first surface; growing an original nitride buffer layer on the first surface and the second portion of the sacrificial layer; removing a top portion of the original nitride buffer layer by a first wet etching process or a dry etching process to expose a top portion of the second portion of the sacrificial layer; and lifting off the second portion of the sacrificial layer disposed on the second surface and a portion of the original nitride buffer layer disposed on the second portion of the sacrificial layer by a second wet etching process, such that the nitride buffer layer remains and is in direct contact with the first surface of the patterned substrate and no substantial nitride buffer layer remains on the second surface of the patterned substrate.

In another aspect according to some embodiments of the present disclosure, a semiconductor epitaxial structure comprises: a patterned substrate including at least a plane surface area and a raised surface area; a nitride buffer layer disposed on the plane surface area of the patterned substrate; and a nitride epitaxial layer nucleated and grown on the nitride buffer layer. The nitride buffer layer is in direct contact with the plane surface area of the patterned substrate and no substantial nitride buffer layer is disposed on the raised surface area of the patterned substrate. As a result, the epitaxial layer does not include multiple crystal surfaces having different crystal growth directions that cause a stress at a junction interface where the crystal surfaces having the different crystal growth directions meet.

Other aspects and embodiments of this disclosure are also contemplated. The foregoing summary and the following detailed description are not meant to restrict this disclosure to any particular embodiment but are merely meant to describe some embodiments of this disclosure.

BRIEF DESCRIPTION OF THE DRAWINGS

For a better understanding of the nature and objects of some embodiments of this disclosure, reference should be made to the following detailed description taken in conjunction with the accompanying drawings.

FIG. 8 schematically illustrates a flow chart of a method of selectively growing a nitride buffer layer on a patterned substrate and growing an epitaxial layer on the selectively grown nitride buffer layer.

DETAILED DESCRIPTION

An epitaxial wafer is a wafer of semiconducting material fabricated by epitaxial growth for use in manufacturing LED chips or other semiconductor chips. The epitaxial wafer includes one or more epitaxial layers that may be the same material as, or different material from a substrate of the wafer.

As an attempt to improve the crystal quality and light extraction efficacy of the epitaxial layer (e.g., LED chip wafers), a patterned substrate (e.g., patterned sapphire substrate) may be used as a substrate for epitaxial growth. A patterned substrate may be fabricated on a regular planar substrate by forming periodic pattern(s) (e.g., two-dimensional periodic patterns) on the planar substrate by photolithography and etching. Common patterns of the patterned substrate include, e.g., cone-shaped patterns, bullet-shaped patterns, hexagonal patterns, etc. In order to achieve a high-quality nitride epitaxial layer by using a metal-organic chemical vapor deposition (MOCVD) method on a substrate, typically a nitride buffer layer is deposited at a relatively low temperature, and a nitride epitaxial layer is then grown on the buffer layer at a relatively high temperature to achieve a monocrystalline layer. In some embodiments, a patterned substrate may suppress or eliminate lattice stress and/or lattice dislocations caused by release of the lattice stress. A patterned substrate may also increase light extraction efficacy by, e.g., increasing an area of total internal reflection.

Figure 1:
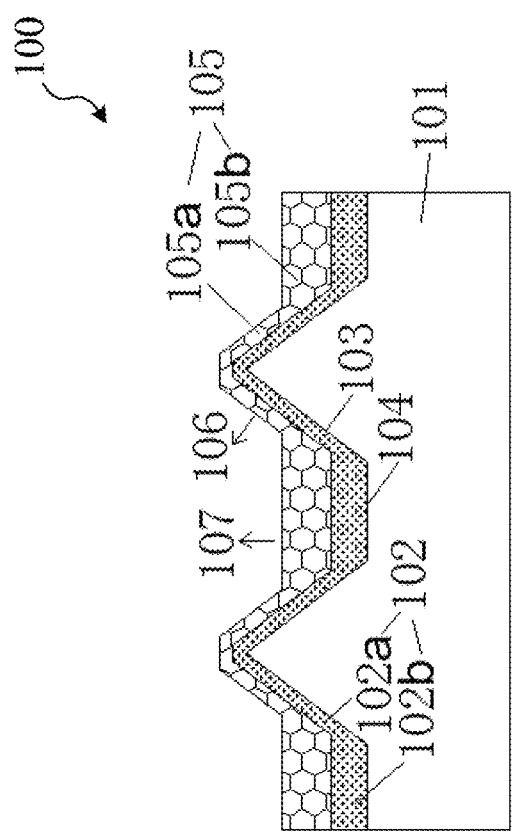
FIG. 1 schematically illustrates a cross-sectional view of an epitaxial wafer.

FIG. 1 schematically illustrates a cross-sectional view of an epitaxial wafer. The epitaxial wafer 100 includes a patterned substrate 101, a nitride buffer layer 102, and a nitride epitaxial layer 105.

As shown in FIG. 1, when the nitride buffer layer 102 is deposited on the patterned substrate 101, the nitride buffer layer 102 is simultaneously deposited on both the sidewalls 103 and the horizontal planes 104 of the patterned substrate 101. In a subsequent epitaxial growth process, the nitride epitaxial layer 105 simultaneously undergoes nucleus growth along one or more lateral directions 106 and a substrate normal direction 107, respectively based on the nitride buffer layer 102a on the sidewalls 103 and the nitride buffer layer 102b on the horizontal planes 104.

The nitride epitaxial layer 105a grown along the lateral directions 106 and the nitride epitaxial layer 105b grown along the substrate normal direction 107 meet each other at a junction interface and cause a significant stress at the interface. The stress at the interface causes the epitaxial wafer to warp, which decreases the uniformity of the epitaxial wafer. In addition, defects and dislocations may occur as a result of stress release at the junction interface, and reduce reliability of products (e.g., LED chips) made from the wafers.

According to at least some embodiments of the present disclosure, in order to solve the above-mentioned drawbacks, a selectively grown nitride buffer layer and a manufacturing method thereof are described. FIGS. 2-7 schematically illustrate various stages of a method of selectively growing a nitride buffer layer on a patterned substrate and growing an epitaxial layer on the selectively grown nitride buffer layer. In at least some embodiments, a sacrificial layer (e.g., silicon dioxide layer) is deposited on pattern sidewalls of the patterned substrate (but not on the pattern planes), before a buffer layer (e.g., nitride buffer layer) is further deposited on the sacrificial layer. The material of the sacrificial layer (e.g., hard mask materials) can be selected such that a wet etching solution can etch the material of the sacrificial layer but cannot etch the material of the buffer layer.

Two wet etching processes, respectively using two different etching solutions, can be used to remove the sacrificial layer and the buffer layer overlying the sacrificial layer via a lift-off process. As a result, the buffer layer (e.g., nitride buffer layer) overlying pattern sidewalls of the patterned substrate is removed, leaving merely the buffer layer deposited on pattern planes of the patterned substrate. A nitride epitaxial layer can further grow on the buffer layer along the normal direction of the substrate without growth along any other lateral directions.

Figure 2:
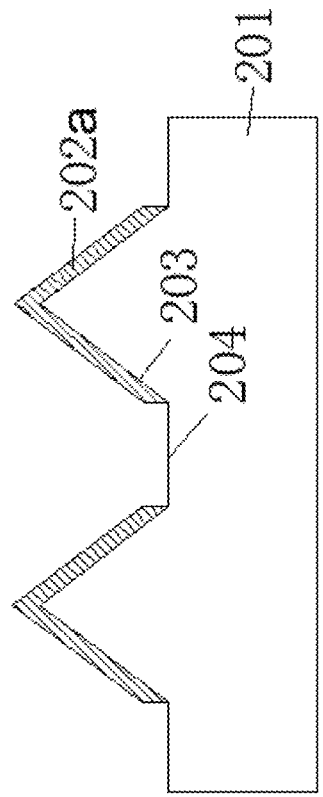
FIG. 2 schematically illustrates various stages of a method of selectively growing a nitride buffer layer on a patterned substrate.

As shown in FIG. 2, a layer of silicon dioxide 202 is uniformly deposited on a patterned substrate 201. The material of the patterned substrate 201 may be, e.g., sapphire, silicon carbide, silicon, gallium nitride, aluminum nitride, or a combination of two or more thereof. The sacrificial layer 202 (e.g. silicon dioxide) covers pattern sidewalls 203 and pattern planes 204 of the patterned substrate 201.

Figure 3:
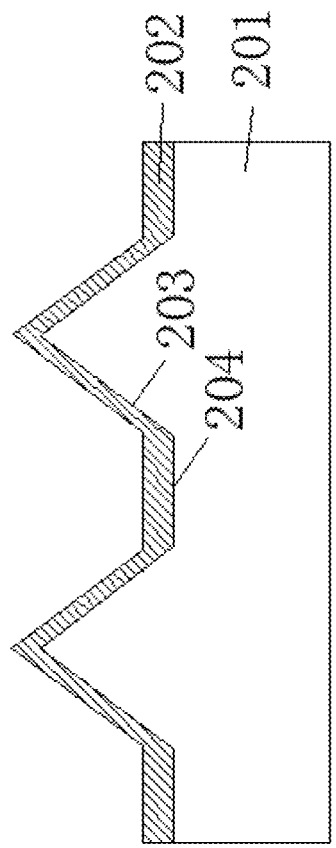
FIG. 3 schematically illustrates various stages of a method of selectively growing a nitride buffer layer on a patterned substrate.

As shown in FIG. 3, a portion of the sacrificial layer 202 overlying the pattern planes 204 is removed by, e.g., photolithography and etching, leaving a sacrificial layer 202a overlying the pattern sidewalls 203. For example, a layer of photoresist can be disposed on the sacrificial layer 202. The photoresist overlying the pattern planes 204 are removed by, e.g., photolithography exposure. The portion of the sacrificial layer 202 overlying the pattern planes 204 can be removed by etching (e.g., wet etching). Another portion of the sacrificial layer 202 overlying the pattern sidewalls 203 are not etched away due to the remaining photoresist. Then the remaining photoresist is removed.

Figure 4:
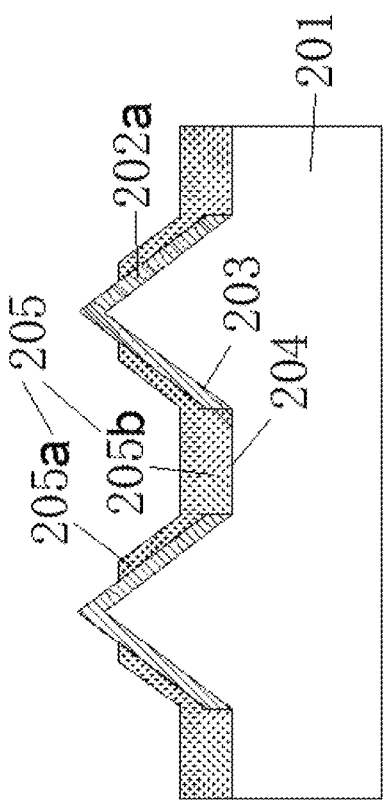
FIG. 4 schematically illustrates various stages of a method of selectively growing a nitride buffer layer on a patterned substrate.

As shown in FIG. 4, a nitride buffer layer 205 is deposited with a thickness in the range of, e.g., from about 0.5 nm to about 500 nm, or from about 1 nm to about 100 nm. A portion of the nitride buffer layer 205a is deposited on the sacrificial layer 202a overlying the pattern sidewalls 203. Another portion of the nitride buffer layer 205b is deposited directly on the pattern planes 204.

Figure 5:
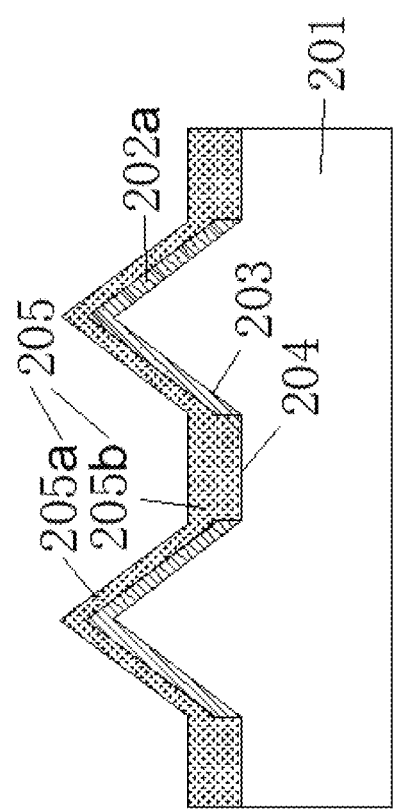
FIG. 5 schematically illustrates various stages of a method of selectively growing a nitride buffer layer on a patterned substrate.

As shown in FIG. 5, a top portion of the nitride buffer layer 205a deposited above a top portion of the patterned substrate 201 (and sacrificial layer 202a) is removed by, e.g., a first wet etching process and/or photolithography. The first wet etching process uses a first etching solution that can etch away the material of the buffer layer (e.g., nitride) but does not etch away the material of the sacrificial layer (e.g., silicon dioxide). As a result, a top portion of the sacrificial layer 202a is exposed. In some embodiments, the top portion of the sacrificial layer 202a has a diameter of less than, or equal to, about 500 nm. Alternatively, the top portion of the patterned substrate 201 can be also removed by, e.g., a dry etching process such as inductively coupled plasma (ICP) or other physical processes.

Figure 6:
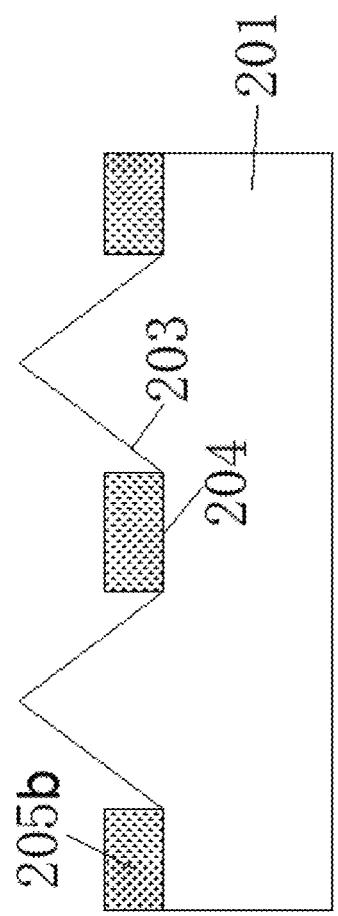
FIG. 6 schematically illustrates various stages of a method of selectively growing a nitride buffer layer on a patterned substrate.

As shown in FIG. 6, the silicon dioxide 202a covering the pattern sidewalls 203 is removed by, e.g., a second wet etching process. The second wet etching process uses a second etching solution (e.g., hydrofluoric acid) that is different from the first etching solution. The second etching solution can etch away the material of the sacrificial layer (e.g., silicon dioxide) but does not etch away the material of the buffer layer (e.g., nitride). As FIGS. 5 and 6 shows, the second etching solution flows into the space between the nitride buffer layer 205a and the sidewalls 203. Since the sacrificial layer 202a is etched away, the nitride buffer layer 205a deposited on the silicon dioxide 202a is also simultaneously removed via the lift-off process. The nitride buffer layer 205b is left in direct contact with the pattern planes 204 of the patterned substrate 201.

The disclosed approach involves two processes of wet etching and is superior over dry etching process such as inductive coupled plasma (ICP). For example, although the ICP process can also remove the nitride buffer layer on the sidewalls 203, the ICP process tends to etch away portions of the nitride buffer layer disposed on the planes 204 that are close to the borders between the sidewalls 203 and the planes 204. In contract, the disclosed approach involving two processes of wet etching can accurately remove the nitride buffer layer on the sidewalls 203 while keeps the nitride buffer layer on the planes 204.

Figure 7:
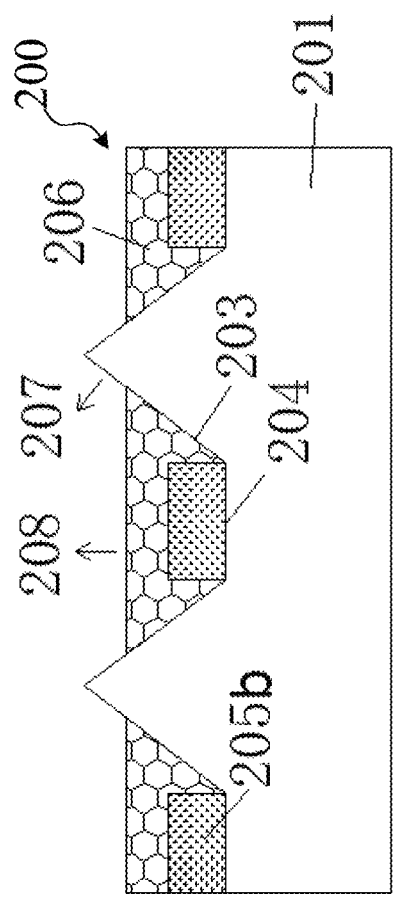
FIG. 7 schematically illustrates growing an epitaxial layer on the selectively grown nitride buffer layer.

As a result, the nitride buffer layer 205b is selectively grown on the patterned substrate 201 as shown in FIG. 6. A nitride epitaxial layer 206 may be further grown on the patterned substrate 201 using, e.g., MOCVD, to form an epitaxial structure 200. As shown in FIG. 7, because the sacrificial layer 202a previously deposited on the pattern sidewalls 203 and the nitride buffer layer 205a overlying the sacrificial layer 202a have already been removed by lift-off, there is no material on the pattern sidewalls 203 that is susceptible to nucleation and growth of the nitride epitaxial layer 206. Thus, the growth pattern of the nitride epitaxial layer 206 along the lateral directions 207 on the pattern sidewalls 203 is suppressed. That is, the crystal plane of the nitride epitaxial layer 206 does not grow along the lateral directions 207.

On the other hand, the nitride buffer layer 205b remains on the pattern planes 204. The nitride epitaxial layer 206 is efficiently nucleated and grown on the nitride buffer layer 205b, so a normal direction of the crystal plane of the nitride epitaxial layer 206 is along the substrate normal direction 208.

In some embodiments, the crystal structures of the nitride buffer layer and the nitride epitaxial layer are different. The nitride buffer layer (e.g., gallium nitride or aluminum nitride) is grown at a relatively low temperature (e.g., about 500 degrees Celsius). As a result, the nitride buffer layer is not a monocrystalline layer. In other words, the crystal phases of the buffer layer (at least the bottom portion of the buffer layer) are random. In contrast, the nitride epitaxial layer is grown at a relatively high temperature (e.g., about 1000 degrees Celsius). As a result, the nitride buffer layer is a monocrystalline layer. In some other embodiments, the materials of the buffer layer and the epitaxial layer are different.

Therefore, using the selectively grown nitride buffer layer and the manufacturing method thereof as disclosed, the crystal surface of the nitride epitaxial layer can grow along the normal direction of the substrate without growth along the lateral directions, thereby avoiding the situation that crystal surfaces grown along multiple different directions and meet at a junction interface causing a significant stress. The disclosed technology suppresses the warpage of the epitaxial wafer and improves the uniformity of the epitaxial wafer. In addition, the disclosed technology reduces or eliminates defects and dislocations at the interface between the crystal planes, improving the reliability of products manufacturing using the epitaxial wafer. The epitaxial wafer can be used to manufacture, e.g., LED chips.

FIG. 8 schematically illustrates a flow chart of a method of selectively growing a nitride buffer layer on a patterned substrate and growing an epitaxial layer on the selectively grown nitride buffer layer. The patterned substrate includes periodic patterns of a first surface and a second surface, and normal directions of the first surface and the second surface are different. The first surface may be, e.g., a plane surface area that is substantially parallel to the patterned substrate. The second surface may be, e.g., a raised surface area including one or more sidewalls having lateral normal directions that are deviated from a normal direction of the patterned substrate.

At step 805 of the process 800, the method disposes a sacrificial layer on the first surface and the second surface of the patterned substrate, the sacrificial layer including a first portion disposed on the first surface and a second portion disposed on the second surface.

At step 810, the method exposes the first surface by removing the first portion of the sacrificial layer disposed on the first surface. For example, the first portion of the sacrificial layer can be removed by photolithography and etching as disclosed above.

At step 815, the method grows an original nitride buffer layer on both the first surface and the second portion of the sacrificial layer.

At step 820, the method removes a top portion of the original nitride buffer layer by a first wet etching process or a dry etching process to expose a top portion of the second portion of the sacrificial layer (as shown in FIG. 5). In some embodiments, the top portion of the original nitride buffer layer being removed has a diameter of less than or equal to about 500 nm.

At step 825, the method lifts off the second portion of the sacrificial layer disposed on the second surface and a portion of the original nitride buffer layer disposed on the second portion of the sacrificial layer by a second wet etching process, such that the nitride buffer layer remains and is in direct contact with the first surface of the patterned substrate and no nitride buffer layer remains on the second surface of the patterned substrate. In some embodiments, the second wet etching process uses a second chemical that etches a material of the sacrificial layer but does not etch a nitride material of the original nitride buffer layer. The second wet etching process etches away the second portion of the sacrificial layer underneath the portion of the original nitride buffer layer, such that the portion of the original nitride buffer layer is lifted off along with the second portion of the sacrificial layer.

At step 830, the method grows an epitaxial layer on the nitride buffer layer, wherein a crystal surface of the epitaxial layer grows along a normal direction of the patterned substrate. The epitaxial layer does not include multiple crystal surfaces having different crystal growth directions that cause a stress at a junction interface where the crystal surfaces having the different crystal growth directions meet.

Although various examples described and illustrated herein disclose that various layers include semiconductor materials (undoped, N-doped, or P-doped semiconductors), it is to be understood that the technology disclosed herein may be applied to chips including various types of semiconductor materials, such as gallium nitride (GaN) and/or aluminum nitride (AlN), indium nitride (InN), gallium arsenide (GaAs), aluminum arsenide (AlAs), indium arsenide (InAs), aluminum phosphide (AlP), gallium phosphide (GaP), indium phosphide (InP), aluminum antimonide (AlSb), gallium antimonide (GaSb), indium antimonide (InSb), or any compound or alloy thereof (e.g., AlGaN, GaInN, AlInN, AlGaInN, AlGaAs, GaInAs, AlInAs, AlGaInAs, AlInP, GaInP, AlGaInP, AlInSb, GaInSb, AlGaSb, AlGaInSb, etc.). In other words, the semiconductor material may be formed of, or at least include, e.g., a nitride compound, an alloy of nitride compounds, an arsenide compound, an alloy of arsenide compounds, a phosphide compound, an alloy of phosphide compounds, an antimonide compound, an alloy of antimonide compounds, a ternary alloy of group III elements and group V elements, or a quaternary alloy of group III elements and group V elements.

As used herein, the singular terms "a," "an," and "the" may include plural referents unless the context clearly dictates otherwise.

Spatial descriptions, such as "overlying" "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A method of manufacturing semiconductor wafers, comprising:
   selectively growing a nitride buffer layer on a first surface of a patterned substrate by disposing a sacrificial layer on the first surface and a second surface of the patterned substrate, the patterned substrate including at least the first surface and the second surface having different normal directions, and the sacrificial layer including a first portion disposed on the first surface and a second portion disposed on the second surface;
   exposing the first surface by removing the first portion of the sacrificial layer disposed on the first surface;
   growing an original nitride buffer layer on the first surface and the second portion of the sacrificial layer;
   removing a top portion of the original nitride buffer layer to expose a top portion of the second portion of the sacrificial layer; and
   lifting off the second portion of the sacrificial layer disposed on the second surface and a portion of the original nitride buffer layer disposed on the second portion of the sacrificial layer; and
   growing an epitaxial layer on the nitride buffer layer, wherein a crystal surface of the epitaxial layer grows along a normal direction of the patterned substrate.

2. The method of claim 1, wherein the nitride buffer layer is in direct contact with the first surface of the patterned substrate.

3. The method of claim 1, wherein the epitaxial layer does not include multiple crystal surfaces having different crystal growth directions that cause a stress at a junction interface where the crystal surfaces having the different crystal growth directions meet.

4. The method of claim 1, wherein a first normal direction of the first surface is parallel to the normal direction of the patterned substrate.

5. The method of claim 1, wherein a second normal direction of the second surface is different from the normal direction of the patterned substrate.

6. The method of claim 1, wherein the second surface includes sidewalls having lateral normal directions that are deviated from the normal direction of the patterned substrate.

7. The method of claim 1, wherein the epitaxial layer is a nitride epitaxial layer.

8. The method of claim 1, wherein
   said removing the top portion of the original nitride buffer layer further comprises removing the top portion of the original nitride buffer layer by a first wet etching process or a dry etching process; and
   said lifting off the second portion of the sacrificial layer disposed on the second surface and the portion of the original nitride buffer layer disposed on the second portion of the sacrificial layer further comprises lifting off the second portion of the sacrificial layer disposed on the second surface and the portion of the original nitride buffer layer disposed on the second portion of the sacrificial layer by a second wet etching process, such that the nitride buffer layer remains and is in direct contact with the first surface of the patterned substrate.

9. The method of claim 8, wherein the second wet etching process etches away the second portion of the sacrificial layer underneath the portion of the original nitride buffer layer, such that the portion of the original nitride buffer layer is lifted off along with the second portion of the sacrificial layer.

10. The method of claim 1, wherein the top portion of the original nitride buffer layer being removed has a diameter of less than or equal to 500 nm.

11. The method of claim 8, wherein the second wet etching process uses a second chemical that etches a material of the sacrificial layer but does not etch a nitride material of the original nitride buffer layer.

12. The method of claim 1, wherein the sacrificial layer includes silicon dioxide.

13. The method of claim 1, wherein the first portion of the sacrificial layer is removed by photolithography and etching.

14. The method of claim 1, wherein the patterned substrate includes periodic patterns of the first surface and the second surface, and normal directions of the first surface and the second surface are different.

15. The method of claim 1, wherein a thickness of the nitride buffer layer is from 0.5 nm to 500 nm.

16. A semiconductor wafer, comprising:
   a selectively-grown nitride buffer layer on a first surface of a patterned substrate, the patterned substrate including at least the first surface and a second surface having different normal directions; and an epitaxial layer grown on the nitride buffer layer, wherein a crystal surface of the epitaxial layer grows along a normal direction of the patterned substrate, wherein the selectively-grown nitride buffer layer is grown using acts comprising:

disposing a sacrificial layer on the first surface and the second surface of the patterned substrate, the sacrificial layer including a first portion disposed on the first surface and a second portion disposed on the second surface;

exposing the first surface by removing the first portion of the sacrificial layer disposed on the first surface;

growing an original nitride buffer layer on the first surface and the second portion of the sacrificial layer;

removing a top portion of the original nitride buffer layer to expose a top portion of the second portion of the sacrificial layer; and lifting off the second portion of the sacrificial layer disposed on the second surface and a portion of the original nitride buffer layer disposed on the second portion of the sacrificial layer.

17. The semiconductor wafer of claim 16, wherein the nitride buffer layer is in direct contact with the first surface of the patterned substrate.

18. The semiconductor wafer of claim 16, wherein the epitaxial layer does not include multiple crystal surfaces having different crystal growth directions that cause a stress at a junction interface where the crystal surfaces having the different crystal growth directions meet.

19. The semiconductor wafer of claim 16, wherein a first normal direction of the first surface is parallel to the normal direction of the patterned substrate, and a second normal direction of the second surface is different from the normal direction of the patterned substrate.

20. The semiconductor wafer of claim 16, wherein the second surface includes sidewalls having lateral normal directions that are deviated from the normal direction of the patterned substrate.

* * * * *